(12) United States Patent
Nagano et al.

(10) Patent No.: US 8,451,395 B2
(45) Date of Patent: May 28, 2013

(54) THIN-FILM TRANSISTOR ARRAY SUBSTRATE, METHOD OF MANUFACTURING THE SAME, AND LIQUID CRYSTAL DISPLAY DEVICE

(75) Inventors: Shingo Nagano, Tokyo (JP); Yuichi Masutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 623 days.

(21) Appl. No.: 12/689,575

(22) Filed: Jan. 19, 2010

(65) Prior Publication Data
US 2010/0187532 A1    Jul. 29, 2010

(30) Foreign Application Priority Data

Jan. 23, 2009  (JP) .................. 2009-012852
Dec. 11, 2009  (JP) .................. 2009-281645

(51) Int. Cl.
*G02F 1/136*  (2006.01)
*H01L 21/00*  (2006.01)
*H01L 31/00*  (2006.01)

(52) U.S. Cl.
USPC ............. 349/43; 349/140; 257/59; 257/72; 438/30; 438/149

(58) Field of Classification Search
None
See application file for complete search history.

(56) References Cited

U.S. PATENT DOCUMENTS

| | | | |
|---|---|---|---|
| 6,449,026 | B1 | 9/2002 | Min et al. |
| 7,830,464 | B2 | 11/2010 | Song et al. |
| 2001/0007779 | A1 | 7/2001 | Lee et al. |
| 2001/0010370 | A1 | 8/2001 | Kimura et al. |
| 2001/0046027 | A1 | 11/2001 | Tai et al. |
| 2002/0041354 | A1 | 4/2002 | Noh et al. |
| 2003/0013221 | A1 | 1/2003 | Kimura et al. |
| 2005/0200790 | A1 | 9/2005 | Konno et al. |
| 2006/0138417 | A1 | 6/2006 | Ahn et al. |
| 2007/0153151 | A1 | 7/2007 | Yang |
| 2007/0268440 | A1 | 11/2007 | Nagano |

(Continued)

FOREIGN PATENT DOCUMENTS

| | | |
|---|---|---|
| JP | 63-15472 | 1/1988 |
| JP | 11-2828 | 1/1999 |

(Continued)

OTHER PUBLICATIONS

Korean Office Action issued on Apr. 22, 2011 in corresponding Korean Application No. 10-2010-0005038 (with an English Translation).

*Primary Examiner* — Michelle R Connelly
(74) *Attorney, Agent, or Firm* — Oblon, Spivak, McClelland, Maier & Neustadt, L.L.P.

(57) ABSTRACT

A thin-film transistor array substrate includes a source line that is formed above a gate insulating layer covering a gate line, a semiconductor layer that is formed on the gate insulating layer and placed in a substantially whole area below a drain electrode, in a substantially whole area below a source electrode, in a substantially whole area below the source line and in a position opposite to the gate electrode, a pixel electrode that is formed directly on the drain electrode, a transparent conductive pattern that is formed directly on the source electrode and the source line in the same layer as the pixel electrode, and a counter electrode that is formed on an interlayer insulating layer covering the pixel electrode and the transparent conductive pattern and generates a fringe electric field with the pixel electrode.

14 Claims, 19 Drawing Sheets

U.S. PATENT DOCUMENTS

| | | |
|---|---|---|
| 2008/0002126 A1 | 1/2008 | Lim et al. |
| 2008/0042963 A1 | 2/2008 | Fujita |
| 2008/0186440 A1 | 8/2008 | Lim et al. |
| 2008/0303024 A1* | 12/2008 | Song et al. .............. 257/59 |
| 2009/0015533 A1 | 1/2009 | Fujita et al. |
| 2009/0207362 A1 | 8/2009 | Nagano et al. |

FOREIGN PATENT DOCUMENTS

| | | |
|---|---|---|
| JP | 2001-56474 | 2/2001 |
| JP | 2001-154214 | 6/2001 |
| JP | 2001-235763 | 8/2001 |
| JP | 2001-250958 | 9/2001 |
| JP | 2002-182230 | 6/2002 |
| JP | 2005-257883 | 9/2005 |
| JP | 2007-183615 A | 7/2007 |
| JP | 2007-293155 A | 11/2007 |
| JP | 2008-33247 | 2/2008 |
| JP | 2008-52161 | 3/2008 |
| KR | 10-2002-0046022 A | 6/2002 |
| KR | 10-2008-0107821 A | 12/2008 |

* cited by examiner

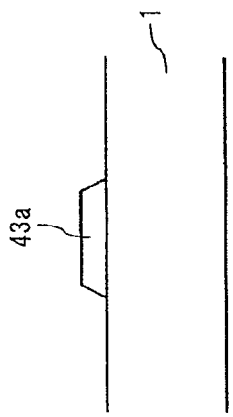
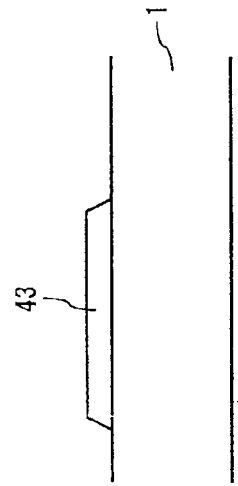

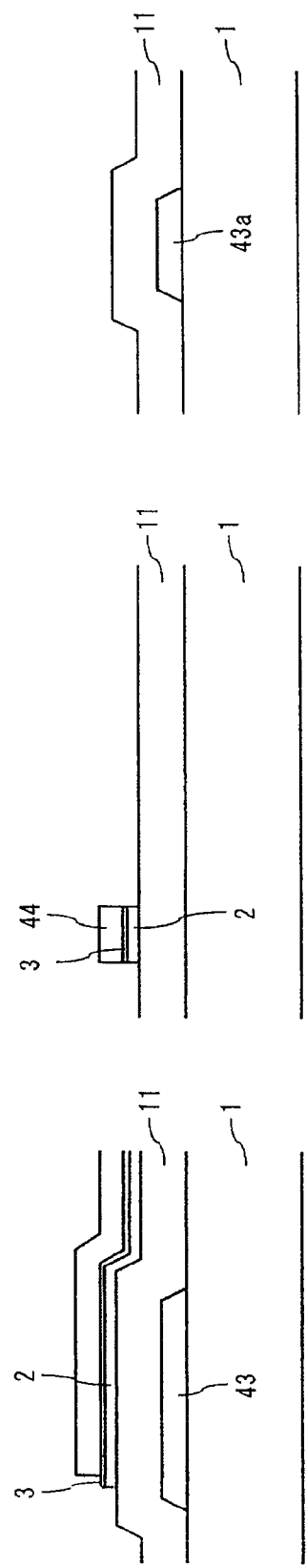

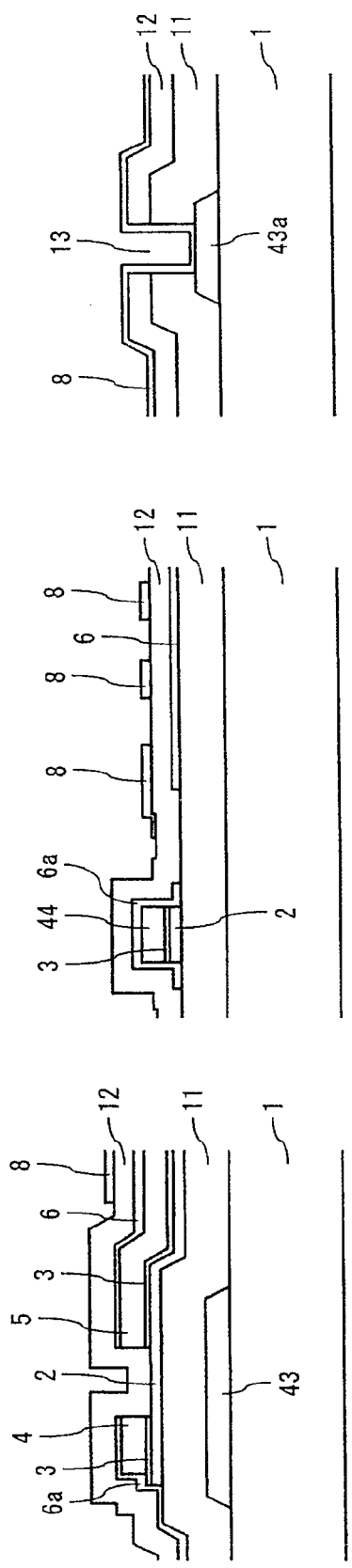

THIN-FILM TRANSISTOR ARRAY SUBSTRATE, METHOD OF MANUFACTURING THE SAME, AND LIQUID CRYSTAL DISPLAY DEVICE

INCORPORATION BY REFERENCE

This application is based upon and claims the benefit of priorities from Japanese patent applications Nos. 2009-012852 filed on Jan. 23, 2009 and 2009-281645 filed on Dec. 11, 2009, the disclosure of which is incorporated herein in its entirety by reference.

BACKGROUND OF THE INVENTION

1. Field of the Invention

The present invention relates to a thin-film transistor array substrate, a method of manufacturing the same, and a liquid crystal display device. Particularly, the present invention relates to a thin-film transistor array substrate to be used for a fringe-field switching mode liquid crystal display device, a method of manufacturing the same, and a liquid crystal display device.

2. Description of Related Art

A fringe-field switching (FFS) mode of a liquid crystal display device is a display technique that displays an image by applying a fringe electric field to liquid crystals filled between substrates placed opposite to each other. Because a pixel electrode and a counter electrode are formed by transparent conductive layers in the FFS mode liquid crystal display device, it is possible to obtain a higher aperture ratio and transmittance compared to an in-plane switching (IPS) mode.

In an FFS mode liquid crystal display device that has been used hitherto, at least six photolithography processes for forming (1) a counter electrode, (2) a gate electrode, (3) a semiconductor layer, (4) source and drain electrodes, (5) a contact hole and (6) a pixel electrode are necessary to manufacture a thin-film transistor (TFT) array substrate. This raises a concern that manufacturing costs are high compared to a twisted nematic (TN) mode in which a TFT array substrate can be manufactured generally by five photolithography processes.

In light of the above concern, Japanese Unexamined Patent Application Publication No. 2001-235763, for example, proposes a technique of reducing the number of photolithography processes with use of a half-tone mask.

However, process control of a photolithography process with use of the half-tone mask is more complicated than that of a normal photolithography process, and there is a problem with stable mass production. Further, the half-tone mask is more expensive than a normal mask, and there is also a problem with cost.

The present invention has been accomplished to solve the above concerns, and it is desirable to provide a thin-film transistor array substrate, a method of manufacturing the same, and a liquid crystal display device which enable reduction of the number of photolithography processes without use of a half-tone mask.

SUMMARY OF THE INVENTION

A first exemplary aspect of the present invention is a thin-film transistor array substrate including a thin-film transistor, which includes a gate line that is formed over a substrate and connected to a gate electrode of the thin-film transistor, a gate insulating layer that covers the gate electrode and the gate line, a source line that is formed above the gate insulating layer and connected to a source electrode of the thin-film transistor, a semiconductor layer that is formed on the gate insulating layer and placed in a substantially whole area below a drain electrode of the thin-film transistor, in a substantially whole area below the source electrode, in a substantially whole area below the source line and in a position opposite to the gate electrode, a pixel electrode that is formed directly on the drain electrode and electrically connected to the drain electrode, a transparent conductive pattern that is formed directly on the source electrode and the source line in the same layer as the pixel electrode, an interlayer insulating layer that covers the pixel electrode and the transparent conductive pattern, and a counter electrode that is formed on the interlayer insulating layer and generates a fringe electric field with the pixel electrode.

A second exemplary aspect of the present invention is a a method of manufacturing a thin-film transistor array substrate including a thin-film transistor, which includes steps of forming a gate electrode of the thin-film transistor and a gate line connected to the gate electrode over a substrate, forming a gate insulating layer that covers the gate electrode and the gate line, depositing a semiconductor layer, an ohmic contact layer and a metal layer in this sequence on the gate insulating layer, patterning the metal layer and forming a source electrode and a drain electrode of the thin-film transistor being joined above a part of the semiconductor layer to serve as a channel region of the thin-film transistor and a source line connected to the source electrode, etching the semiconductor layer and the ohmic contact layer by using the patterned metal layer as a mask, forming a pixel electrode directly on the drain electrode and a transparent conductive pattern directly on the source electrode and the source line by depositing a transparent conductive layer directly on the metal layer and patterning the transparent conductive layer, etching the metal layer and the ohmic contact layer by using the pixel electrode and the transparent conductive pattern as a mask so as to expose the part of the semiconductor layer to serve as the channel region of the thin-film transistor, forming an interlayer insulating layer that covers the pixel electrode and the transparent conductive pattern, and forming a counter electrode that generates a fringe electric field with the pixel electrode on the interlayer insulating layer.

According to the exemplary aspects of the present invention described above, it is possible to provide a thin-film transistor array substrate, a method of manufacturing the same, and a liquid crystal display device which enable reduction of the number of photolithography processes without use of a half-tone mask.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

Figure 4:
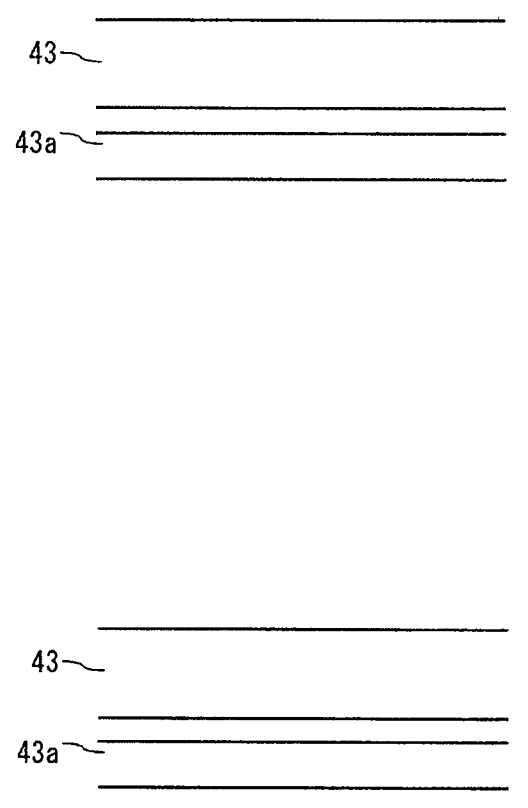

FIG. 4 is a plan view showing one manufacturing step of the TFT array substrate according to the first exemplary embodiment;

FIGS. 9A to 9C are cross-sectional views showing one manufacturing step of the TFT array substrate according to the first exemplary embodiment;

FIGS. 10A to 10C are cross-sectional views showing one manufacturing step of the TFT array substrate according to the first exemplary embodiment;

FIGS. 13A to 13C are cross-sectional views showing one manufacturing step of the TFT array substrate according to the first exemplary embodiment;

DESCRIPTION OF THE EXEMPLARY EMBODIMENTS

Exemplary embodiments of the present invention will be described hereinbelow. The explanation provided hereinbelow merely illustrates the exemplary embodiments of the present invention, and the present invention is not limited to the below-described embodiments. The following description and the attached drawings are appropriately shortened and simplified to clarify the explanation. Further, the redundant explanation is omitted as appropriate to clarify the explanation. In the figures, the identical reference symbols denote identical structural elements and the redundant explanation thereof is omitted.

[First Exemplary Embodiment]

Figure 1:
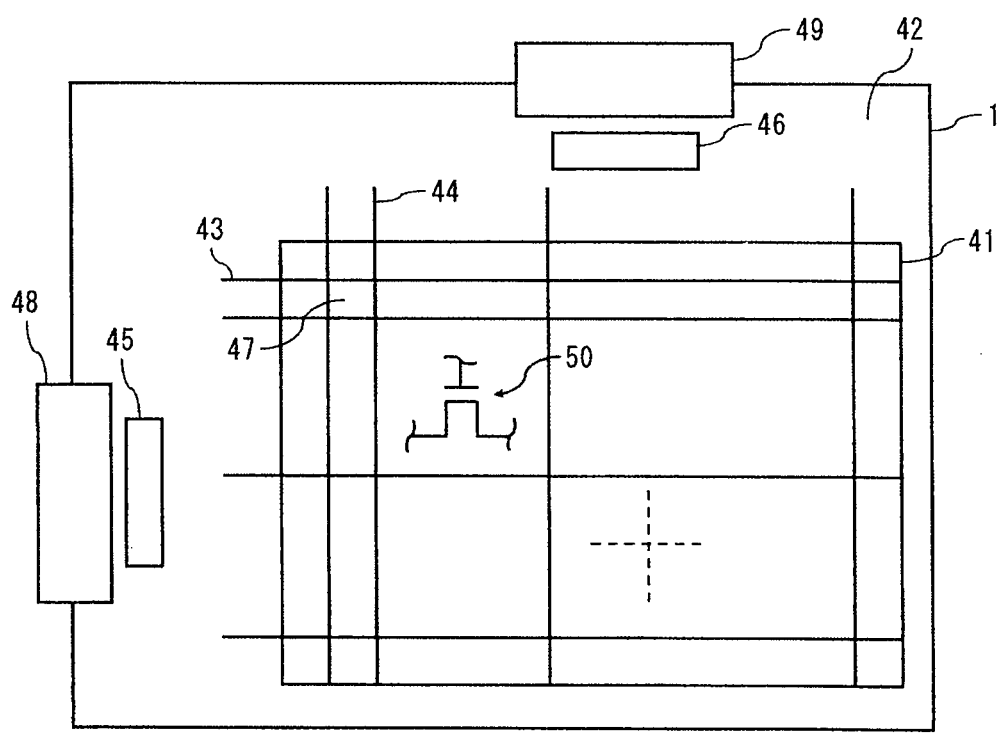
FIG. 1 is a front view showing a structure of a TFT array substrate that is used in a liquid crystal display device according to a first exemplary embodiment.

A liquid crystal display device according to a first exemplary embodiment of the present invention is described firstly with reference to FIG. 1. FIG. 1 is a front view showing a structure of a TFT array substrate that is used in the liquid crystal display device according to the first exemplary embodiment. The liquid crystal display device according to the first exemplary embodiment is an FFS mode liquid crystal display device in which a pixel electrode and a counter electrode are placed in the TFT array substrate. An overall structure of the liquid crystal display device is common among first to third exemplary embodiments described hereinbelow.

The liquid crystal display device according to the first exemplary embodiment includes a substrate 1. The substrate 1 is an array substrate such as a TFT array substrate, for example. The substrate 1 includes a display area 41 and a frame area 42 surrounding the display area 41. In the display area 41, a plurality of gate lines (scanning signal lines) 43 and a plurality of source lines (display signal lines) 44 are placed. The plurality of gate lines 43 are arranged in parallel with each other. Likewise, the plurality of source lines 44 are arranged in parallel with each other. The gate lines 43 and the source lines 44 are arranged to intersect with each other. Each area surrounded by the adjacent gate lines 43 and the adjacent source lines 44 is a pixel 47. Thus, the pixels 47 are arranged in matrix in the display area 41.

In the frame area 42 of the substrate 1, a scanning signal driving circuit 45 and a display signal driving circuit 46 are placed. The gate lines 43 extend from the display area 41 to the frame area 42 and are connected to the scanning signal driving circuit 45 at the end of the substrate 1. Likewise, the source lines 44 extend from the display area 41 to the frame area 42 and are connected to the display signal driving circuit 46 at the end of the substrate 1. An external wiring 48 is connected in close proximity to the scanning signal driving circuit 45. Further, an external wiring 49 is connected in close proximity to the display signal driving circuit 46. The external wirings 48 and 49 are wiring boards such as a flexible printed circuit (FPC), for example.

Various kinds of external signals are supplied to the scanning signal driving circuit 45 and the display signal driving circuit 46 through the external wirings 48 and 49. The scanning signal driving circuit 45 supplies a gate signal (scanning signal) to the gate lines 43 according to an external control signal. In response to the gate signal, the gate lines 43 are sequentially selected. On the other hand, the display signal driving circuit 46 supplies a display signal to the source lines 44 according to an external control signal or display data. A display voltage corresponding to the display data can be thereby supplied to the respective pixels 47.

In the pixel 47, at least one TFT 50 is placed. The TFT 50 is placed in close proximity to the intersection between the source line 44 and the gate line 43. For example, the TFT 50 supplies a display voltage to a pixel electrode. Specifically, the TFT 50, which is a switching element, is turned on by the gate signal from the gate line 43. The display voltage is thereby applied from the source line 44 to the pixel electrode that is connected to a drain electrode of the TFT 50. The pixel electrode is placed opposite to a common electrode (counter electrode) having slits with an insulating layer interposed therebetween. A fringe electric field corresponding to the display voltage is generated between the pixel electrode and the counter electrode. Further, an alignment layer (not shown) is placed on the surface of the substrate 1. A detailed structure of the pixel 47 is described later.

Further, a counter substrate is placed opposite to the substrate 1. The counter substrate is a color filter substrate, for example, and it is placed on the viewing side. In the counter substrate, a color filter, a black matrix (BM), an alignment layer and so on are placed. A liquid crystal layer is placed between the substrate 1 and the counter substrate. In other words, liquid crystals are filled between the substrate 1 and the counter substrate. Further, a polarizing plate, a retardation film and so on are placed on the respective outer sides of the substrate 1 and the counter substrate. In addition, a backlight unit or the like is placed on the non-viewing side of the liquid crystal display panel.

The liquid crystals are driven by a fringe electric field between the pixel electrode and the counter electrode. Specifically, the orientation of the liquid crystals between the substrates is changed. The polarization state of light passing through the liquid crystal layer is thereby changed. Specifically, the polarization state of light that has been linearly polarized through the polarizing plate is changed by the liquid crystal layer. To be more precise, light from the backlight unit becomes linearly polarized light by the polarizing plate on the array substrate side. The linearly polarized light then passes through the liquid crystal layer, thereby changing its polarization state.

The amount of light passing through the polarizing plate on the counter substrate side varies depending on the polarization state. Specifically, the amount of light passing through the polarizing plate on the viewing side, among light from the backlight unit which is transmitted through the liquid crystal display panel, varies. The orientation of the liquid crystals varies depending on a display voltage to be applied. Thus, the amount of light passing through the polarizing plate on the viewing side can be changed by controlling the display voltage. Specifically, a desired image can be displayed by varying the display voltage for each pixel.

Figure 2:
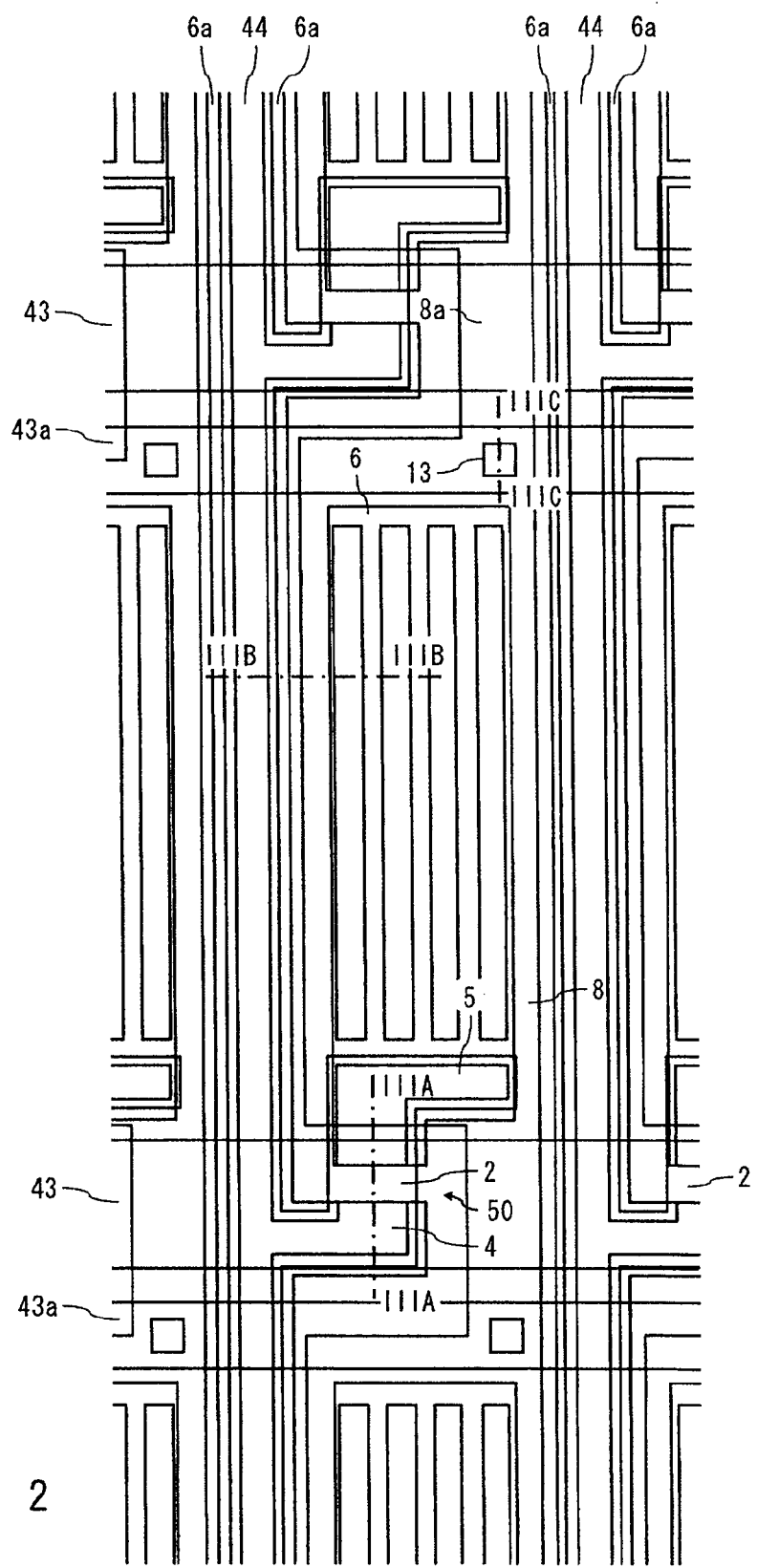
FIG. 2 is a plan view showing a pixel structure of the TFT array substrate according to the first exemplary embodiment.
Figure 3:
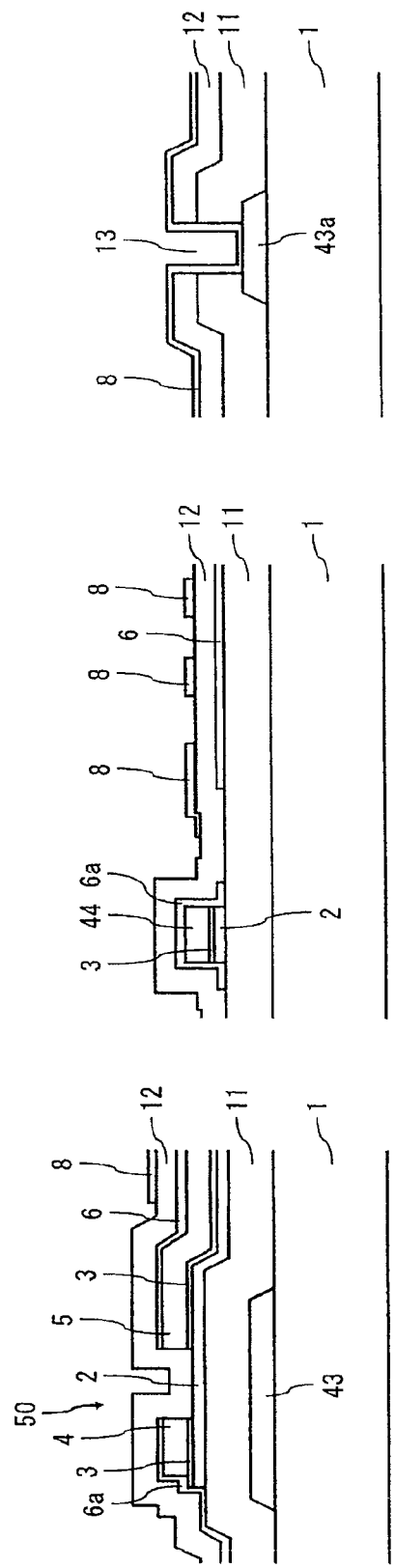
FIG. 3A is a cross-sectional view along line IIIA-IIIA in FIG. 2.
FIG. 3B is a cross-sectional view along line IIIB-IIIB in FIG. 2.
FIG. 3C is a cross-sectional view along line IIIC-IIIC in FIG. 2.
Figure 5:
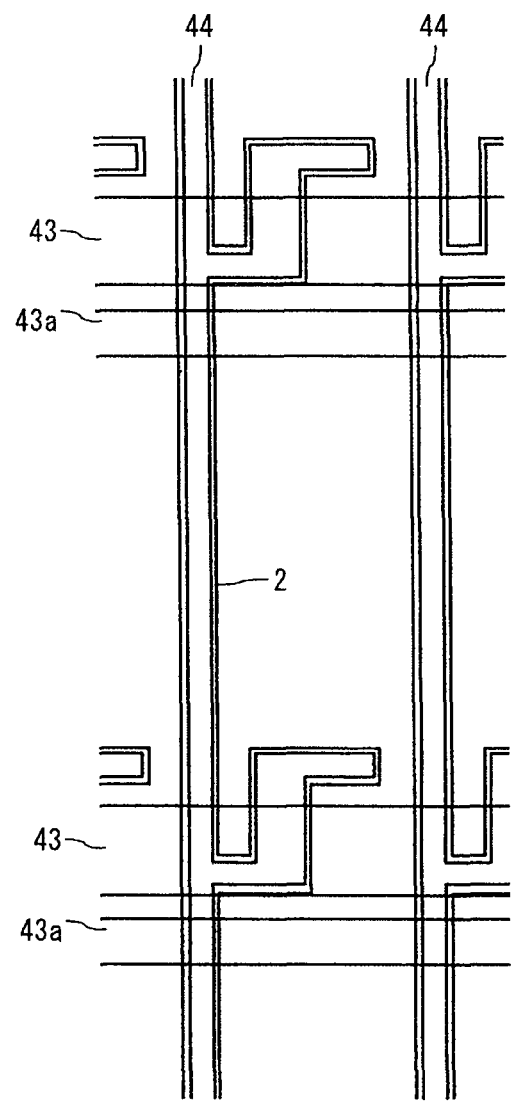
FIG. 5 is a plan view showing one manufacturing step of the TFT array substrate according to the first exemplary embodiment.
Figure 6:
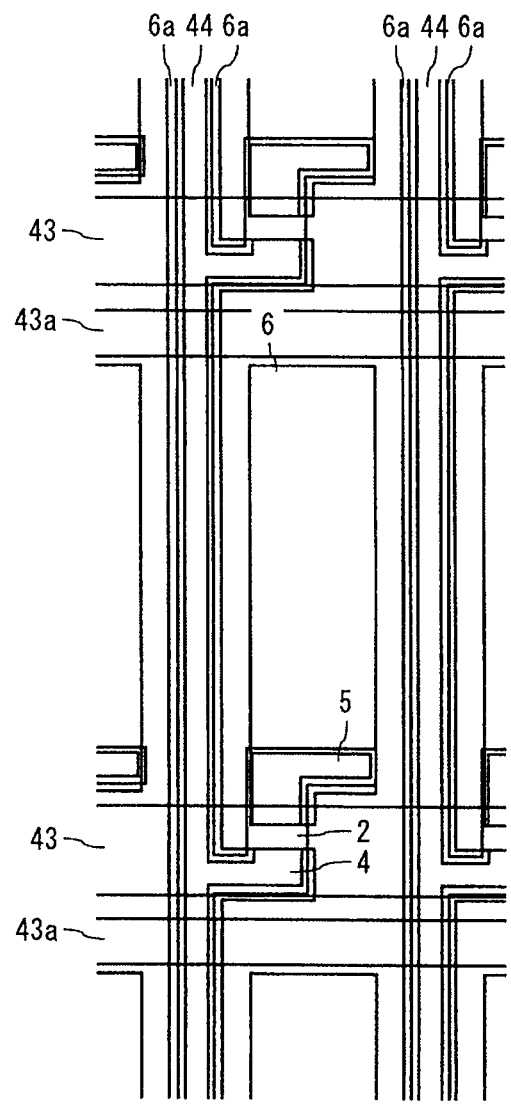
FIG. 6 is a plan view showing one manufacturing step of the TFT array substrate according to the first exemplary embodiment.
Figure 7:
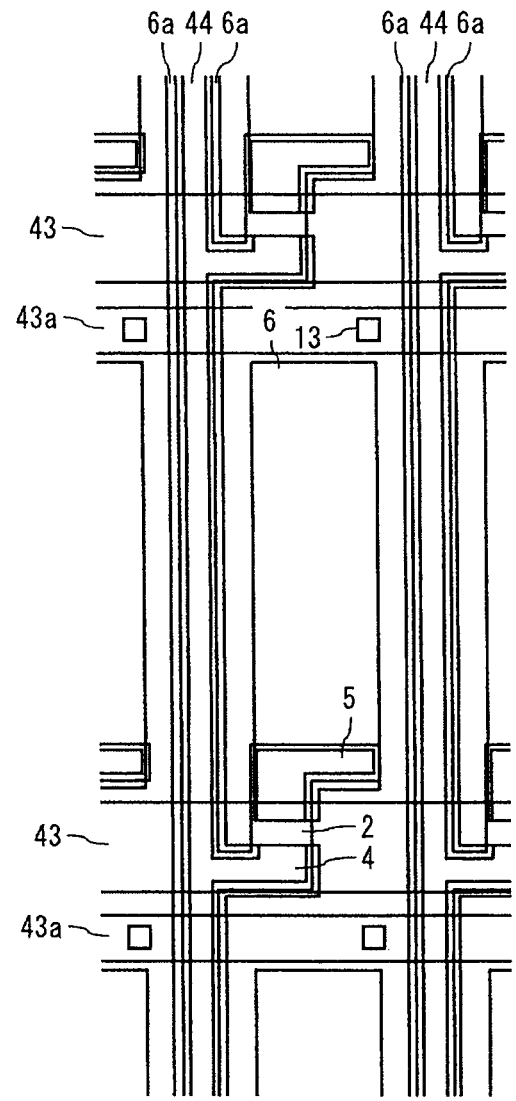
FIG. 7 is a plan view showing one manufacturing step of the TFT array substrate according to the first exemplary embodiment.
Figure 8:
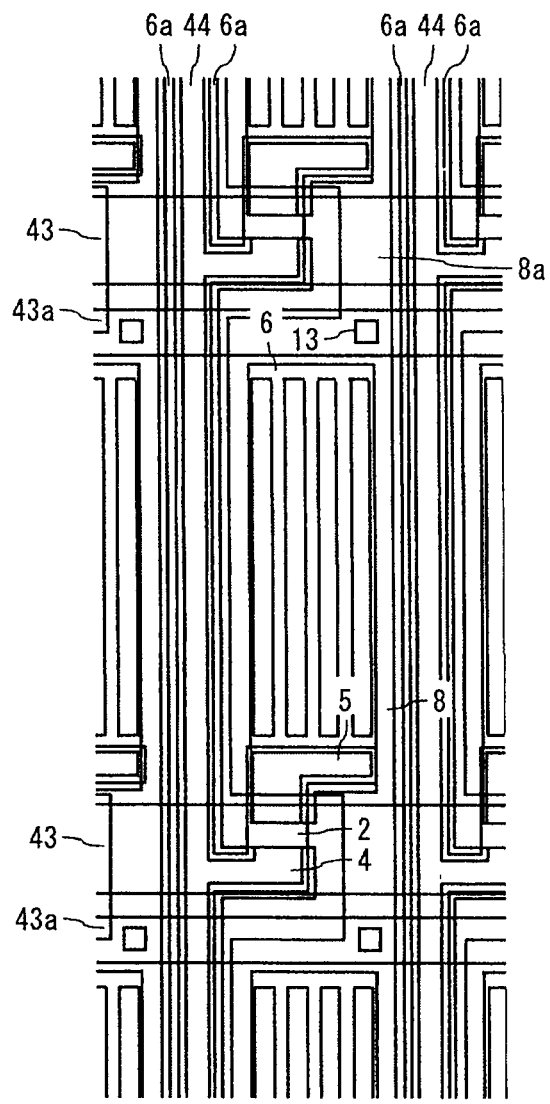
FIG. 8 is a plan view showing one manufacturing step of the TFT array substrate according to the first exemplary embodiment.
Figure 11A:
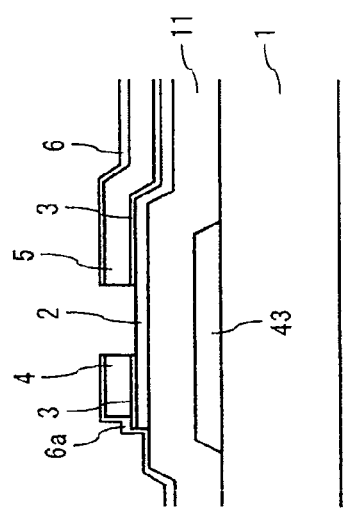
FIGS. 11A to 11C are cross-sectional views showing one manufacturing step of the TFT array substrate according to the first exemplary embodiment.
Figure 11B:
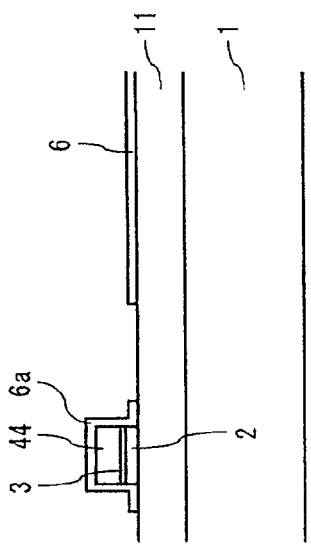
Figure 11C:
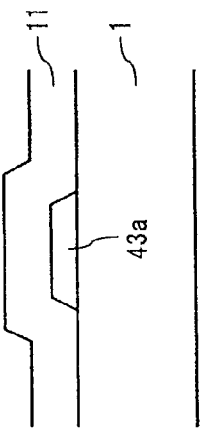
Figures 12A, 12B, 12C:
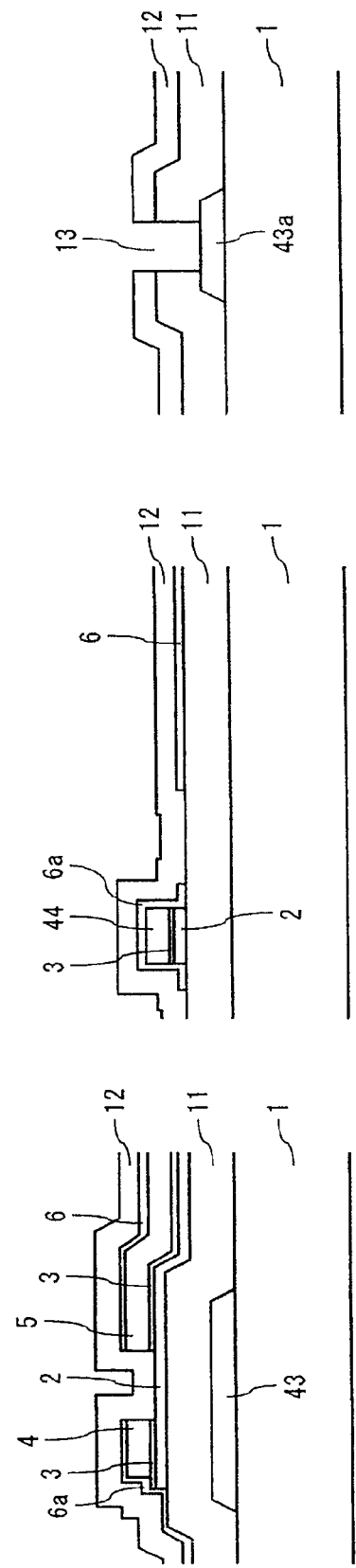
FIGS. 12A to 12C are cross-sectional views showing one manufacturing step of the TFT array substrate according to the first exemplary embodiment.

A pixel structure of the liquid crystal display device according to the first exemplary embodiment is described next with reference to FIG. 2 and FIGS. 3A to 3C. FIG. 2 is a plan view showing the pixel structure of the TFT array substrate according to the first exemplary embodiment. FIGS. 3A to 3C are cross-sectional views showing the pixel structure of the TFT array substrate according to the first exemplary embodiment. FIG. 2 shows one of the pixels 47 of the TFT array substrate. FIG. 3A is a cross-sectional view along line IIIA-IIIA in FIG. 2, FIG. 3B is a cross-sectional view along line IIIB-IIIB in FIG. 2, and FIG. 3C is a cross-sectional view along line IIIC-IIIC in FIG. 2.

Referring to FIG. 2 and FIGS. 3A to 3C, the gate line 43 that is connected to a gate electrode of the TFT 50 is placed on the transparent insulating substrate 1 such as glass. In this example, the gate line 43 is formed in such a way that a part of the gate line 43 serves as the gate electrode. The gate line 43 extends linearly in one direction on the substrate 1. Further, a plurality of common lines 43a are formed in the same layer as the gate lines 43 in the substrate 1. Each common line 43a is placed between the adjacent gate lines 43. The plurality of common lines 43a are arranged in parallel. The common lines 43a and the gate lines 43 are arranged to be substantially parallel with each other. The gate lines 43 and the common lines 43a are formed by a first metal layer that is made of Cr, Al, Ta, Ti, Mo, W, Ni, Cu, Au or Ag, an alloy layer made mainly of those or a stacked layer of those, for example.

A gate insulating layer 11, which is a first insulating layer, is placed to cover the gate line 43 and the common line 43a. The gate insulating layer 11 is made of an insulating layer such as silicon nitride or silicon oxide.

A semiconductor layer 2 is placed on the gate insulating layer 11. In the first exemplary embodiment, the semiconductor layer 2 is placed linearly so as to intersect with the gate line 43 and the common line 43a. In this example, the semiconductor layer 2 is orthogonal to the gate line 43 and the common line 43a, for example. The semiconductor layer 2 extends linearly in the direction intersecting with the gate line 43 on the substrate 1. A plurality of semiconductor layers 2 are arranged with a space therebetween.

The semiconductor layer 2 branches off at the intersection with the gate line 43. The branching part of the semiconductor layer 2 extends along the gate line 43 and further extends into the pixel 47. In a formation area of the TFT 50, the semiconductor layer 2 is placed opposite to a gate electrode with the gate insulating layer 11 interposed therebetween. Specifically, the branching part of the semiconductor layer 2 which branches off at the intersection with the gate line 43 and overlaps with the gate electrode functions as an active region that constitutes the TFT 50. The active region of the semiconductor layer 2 is placed on the gate insulating layer 11 so as to overlap with the gate line 43, and the gate line 43 in an area overlapping with the active region of the semiconductor layer 2 serves as a gate electrode. The semiconductor layer 2 is made of amorphous silicon, polycrystalline polysilicon or the like, for example.

The linear part of the semiconductor layer 2 that extends in the direction intersecting with the gate line 43 can be used as a redundant line of the source line 44, which is described later. Specifically, the linear part of the semiconductor layer 2 is formed in a formation area of the source line 44 and prevents disruption of an electric signal in the event that the source line 44 is broken.

On the semiconductor layer 2, an ohmic contact layer 3 into which conductive impurity is doped is placed. The ohmic contact layer 3 is deposited substantially all over the semiconductor layer 2 except for a channel region of the TFT 50. A part of the semiconductor layer 2 which overlap with the gate electrode and correspond to the ohmic contact layer 3 serves as source and drain regions. Specifically, a part of the semiconductor layer 2 which overlaps with the gate electrode and corresponds to the ohmic contact layer 3 on the left side in FIG. 3A serves as the source region. A part of the semiconductor layer 2 which overlaps with the gate electrode and corresponds to the ohmic contact layer on the right side in FIG. 3A serves as the drain region. In this manner, the source and drain regions are formed at the both ends of the active region of the semiconductor layer 2 which constitutes the TFT 50. Further, a part of the semiconductor layer 2 between the source and drain regions serves as a channel region. The ohmic contact layer 3 is not placed on the channel region of the semiconductor layer 2. The ohmic contact layer 3 is made of n-type amorphous silicon, n-type polycrystalline silicon or the like into which impurity such as phosphorus (P) is doped at high concentration, for example.

A source electrode 4, a drain electrode 5 and a source line 44 are placed on the ohmic contact layer 3. Specifically, the source electrode 4 is placed on the ohmic contact layer 3 on the source region side of the semiconductor layer 2. The drain electrode 5 is placed on the ohmic contact layer 3 on the drain region side of the semiconductor layer 2. The channel-etch type TFT 50 is constructed in this manner. The source electrode 4 and the drain electrode 5 extend to the outside of the channel region of the semiconductor layer 2. Thus, like the ohmic contact layer 3, the source electrode 4 and the drain electrode 5 are not placed on the channel region of the semiconductor layer 2.

The source electrode 4 extends to the outside of the channel region of the semiconductor layer 2 and is connected to the source line 44. Thus, the source line 44 is connected to the source electrode 4. The source line 44 is placed above the semiconductor layer 2 with the ohmic contact layer 3 interposed therebetween, and extends linearly in the direction intersecting with the gate line 43 on the substrate 10. Therefore, the source line 44 branches off at the intersection with the gate line 43 and extends along the gate line 43, to form the source electrode 4. The source electrode 4, the drain electrode 5 and the source line 44 are formed by a second metal layer that is made of Cr, Al, Ta, Ti, Mo, W, Ni, Cu, Au or Ag, an alloy layer made mainly of those or a stacked layer of those, for example.

As described above, in the first exemplary embodiment, the semiconductor layer 2 is placed over substantially the whole area below the source line 44, substantially the whole area below the source electrode 4, substantially the whole area below the drain electrode 5 and a position opposite to the gate electrode. In this example, the ohmic contact layer 3 is placed between the source line 44, the source electrode 4 and the drain electrode 5, respectively, and the semiconductor layer 2.

The drain electrode 5 extends to the outside of the channel region of the semiconductor layer 2 and is electrically connected to a pixel electrode 6. In the first exemplary embodiment, the pixel electrode 6 is formed directly on the drain electrode 5. Specifically, the under surface (the surface on the downside) of the pixel electrode 6 is in direct contact with the top surface (the surface on the upside) of the drain electrode 5. Further, the pixel electrode 6 is placed substantially all over the drain electrode 5. The pixel electrode 6 extends from the position on the drain electrode into the pixel 47, and is placed substantially all over the area surrounded by the source lines 44 and the gate lines 43 which serves as the pixel 47 as shown in FIG. 2 and FIGS. 3A to 3C. In other words, the pixel electrode 6 partly overlaps with the drain electrode 5. Specifically, the pattern end of the pixel electrode 6 on the channel region side is located in substantially the same position as the pattern end of the drain electrode 5 on the channel region side. Therefore, the pattern end of the drain electrode 5 on the channel region side is not covered with the pixel electrode 6. The pixel electrode 6 is placed to cover the pattern end of the drain electrode 5 different from the pattern end on the channel region side. The pixel electrode 6 is formed by a first transparent conductive layer such as ITO.

As described above, the pixel electrode 6 is placed directly in the upper layer of the source electrode 4, the drain electrode 5 and the source line 44 with no insulating layer interposed therebetween. This structure eliminates the need for a contact hole that electrically connects the pixel electrode 6 and the drain electrode 5. Because a part of the pixel electrode 6 is placed directly on top of the drain electrode 5, an electrical connection between those electrodes can be established. It is thereby possible to construct the pixel 47 without allowing for an area to form a contact hole for establishing a connection between the drain electrode 5 and the pixel electrode 6, thereby increasing the aperture ratio.

Further, in the first exemplary embodiment, a transparent conductive pattern 6a is formed by the first transparent conductive layer, which is the same layer as the pixel electrode 6. The transparent conductive pattern 6a is placed directly substantially all over the source electrode 4 and the source line 44. The transparent conductive pattern 6a is placed to cover the source electrode 4 and the source line 44, for example. However, the pattern end of the source electrode 4 on the channel region side is not covered with the transparent conductive pattern 6a. Therefore, the pattern end of the transparent conductive pattern 6a on the channel region side is in substantially the same position as the pattern end of the source electrode 4 on the channel region side. The transparent conductive pattern 6a and the pixel electrode 6 are arranged to spaced apart from each other. Further, the transparent conductive pattern 6a and the pixel electrode 6 are not placed above the channel region of the semiconductor layer 2.

As described above, in the first exemplary embodiment, the pixel electrode 6 or the transparent conductive pattern 6a which is made of the first transparent conductive layer is placed on top of the source electrode 4, the drain electrode 5 and the source line 44 which are made of the second metal layer. In this example, the pattern formed by the first transparent conductive layer is formed to completely cover the entire area of the pattern formed by the second metal layer except for the channel region of the TFT 50. The source line 44 for supplying a display signal to each pixel 47 can thereby have a stacked structure of the second metal layer and the first transparent conductive layer. This offers an advantage of suppressing the occurrence of a break of the source line 44. Specifically, the transparent conductive pattern 6a that is placed on top of the source line 44 can be used as a redundant line of the source line 44, like the semiconductor layer 2 placed below the source line 44. It is thereby possible to prevent the disruption of the display signal in the event that the source line 44 is broken.

Further, an interlayer insulating layer 12, which is a second insulating layer, is placed to cover the pixel electrode 6 and the transparent conductive pattern 6a. The interlayer insulating layer 12 covers the TFT 50. The interlayer insulating layer 12 is made of an insulating layer such as silicon nitride or silicon oxide.

Furthermore, in the first exemplary embodiment, a counter electrode 8 is placed on the interlayer insulating layer 12. The counter electrode 8 is placed opposite to the pixel electrode 6 with the interlayer insulating layer 12 interposed therebetween, and the counter electrode 8 has a slit for generating a fringe electric field with the pixel electrode 6. As shown in FIG. 2, a plurality of slits are formed substantially in parallel with the source lines 44. The slits are arranged linearly in the direction intersecting with the gate lines 43, for example.

The counter electrode 8 is electrically connected to the common line 43a through a contact hole 13 that penetrates the interlayer insulating layer 12 and the gate insulating layer 11. Further, the counter electrode 8 formed to be connected to the counter electrode 8 of the next pixel 47 that is adjacent with the gate line 43 interposed therebetween. In other words, the counter electrode 8 is integrally formed with the counter electrode 8 of the pixel 47 that is adjacent with the gate line 43 interposed therebetween. Specifically, the counter electrodes 8 of the pixels 47 that are adjacent to each other with the gate line 43 interposed therebetween are joined by a joint portion 8a. The joint portion 8a is placed to come over the gate line 43 and thereby joins the counter electrodes 8 in the pixels 47 that are adjacent to each other with the gate line 43 interposed therebetween. In this example, the joint portion 8a of the counter electrode 8 is placed to step over the gate line 43 in an area not overlapping with the source line 44 or the TFT 50. In other words, the counter electrode 8 at least partly overlaps with the gate line 43. The counter electrode 8 is made of a second transparent conductive layer such as ITO.

A method of manufacturing the liquid crystal display device according to the first exemplary embodiment is described hereinafter with reference to FIGS. 4 to 13C. FIGS.

4 to 8 are plan views showing manufacturing steps of the TFT array substrate according to the first exemplary embodiment. FIGS. 9A to 9C, 10A to 10C, 11A to 11C, 12A to 12C and 13A to 13C are cross-sectional views showing manufacturing steps of the TFT array substrate according to the first exemplary embodiment. FIG. 9A, 10A, 11A, 12A and 13A are cross-sectional views corresponding to the cross-section along line IIIA-IIIA in FIG. 2. FIG. 9B, 10B, 11B, 12B and 13B are cross-sectional views corresponding to the cross-section along line IIIB-IIIB in FIG. 2. FIG. 9C, 10C, 11C, 12C and 13C are cross-sectional views corresponding to the cross-section along line IIIC-IIIC in FIG. 2. Thus, those figures are cross-sectional views showing manufacturing steps which respectively correspond to FIGS. 3A to 3C.

Firstly, a first metal layer that is made of Cr, Al, Ta, Ti, Mo, W, Ni, Cu, Au or Ag, an alloy layer made mainly of those or a stacked layer of those is deposited all over the transparent insulating substrate 1 such as glass. The first metal layer is formed all over the substrate 1 by sputtering or vapor deposition, for example. Next, a resist is applied thereon, and the applied resist is exposed to light through a photomask. The resist is then developed, thereby patterning the resist. The series of processing is referred to hereinafter as a photolithography process. After that, the film is etched using the resist pattern as a mask, thereby removing the photoresist pattern. The series of processing is referred to hereinafter as a micropatterning process. The gate electrode, the gate line 43 and the common line 43a are thereby patterned as shown in FIG. 4 and FIGS. 9A to 9C. In this manner, the gate electrode, the gate line 43 and the common line 43a are formed by the first photolithography process and the micropatterning process.

Next, a first insulating layer to serve as the gate insulating layer 11, the semiconductor layer 2 and the ohmic contact layer 3 are deposited in this sequence so as to cover the gate electrode, the gate line 43 and the common line 43a. They are formed all over the substrate 1 by plasma CVD, atmospheric pressure CVD, low-pressure CVD or the like, for example. Silicon nitride, silicon oxide or the like may be used as the gate insulating layer 11. The gate insulating layer 11 is preferably deposited a plurality of times in order to prevent short-circuit due to the occurrence of a defect such as a pinhole. The material of the semiconductor layer 2 may be amorphous silicon, polycrystalline polysilicon or the like. The material of the ohmic contact layer 3 may be n-type amorphous silicon, n-type polycrystalline silicon or the like into which impurity such as phosphorus (P) is doped at high concentration, for example.

Then, in the first exemplary embodiment, the second metal layer that is made of Cr, Al, Ta, Ti, Mo, W, Ni, Cu, Au or Ag, an alloy layer made mainly of those or a stacked layer of those is deposited on the ohmic contact layer 3. The second metal layer is formed by sputtering or vapor deposition, for example. Then, the second metal layer is patterned by the second photolithography process and the micropatterning process. The source line 44 and the branching part of the source line 44 that extends onto the formation area of the TFT 50 are thereby formed by the second metal layer. The branching part of the source line 44 is formed to branch off at the intersection with the gate line 43 and extend into the pixel 47 so that it includes the source electrode 4 and the drain electrode 5, which are separated in the subsequent step. Specifically, in this step, the second metal layer remains on the channel region, thus having a pattern in which the source electrode 4 and the drain electrode 5 are connected to each other. Thus, the source electrode 4 and the drain electrode 5 in the state where they are joined on the semiconductor layer 2 serving as the channel region of the TFT 50 and the source line 44 connected to the source electrode 4 are formed by patterning of the second metal layer.

Then, the ohmic contact layer 3 and the semiconductor layer 2 are etched by using the patterned second metal layer or the resist pattern used when patterning the second metal layer (or in the state where the resist pattern used when patterning the second metal layer remains) as a mask. The part of the ohmic contact layer 3 and the semiconductor layer 2 which is not covered with the second metal layer is thereby removed as shown in FIG. 5 and FIGS. 10A to 10C. By patterning the ohmic contact layer 3 and the semiconductor layer 2 in this manner, patterning of the ohmic contact layer 3 and the semiconductor layer 2 can be integrated with patterning of the source line 44. It is thus possible to complete patterning of the ohmic contact layer 3 and the semiconductor layer 2 and patterning of the source line 44 in one-time photolithography process.

Further, the first transparent conductive layer such as ITO is deposited thereon all over the substrate 1 by sputtering or the like. Then, the first transparent conductive layer is patterned by the third photolithography process and the micropatterning process. In the first exemplary embodiment, patterning is performed in such a way that the first transparent conductive layer remains on the formation area of the pixel electrode 6 and on the second metal layer excluding the channel region of the TFT 50. The transparent conductive pattern 6a is thereby formed on the source line 44 and on the part branching off the source line 44 which serves as the source electrode 4. Further, the pixel electrode 6 is formed to partly overlap the part branching off the source line 44 which serves as the drain electrode 5. The transparent conductive pattern 6a and the pixel electrode 6 that are made of the first transparent conductive layer function as an etching barrier pattern in a channel etching process, which is described later.

Then, the second metal layer and the ohmic contact layer 3 above the channel region are etched by using the pixel electrode 6 and the transparent conductive pattern 6a as a mask. Specifically, the exposed part of the second metal layer which is exposed without being covered with the pixel electrode 6 or the transparent conductive pattern 6a is etched away. The second metal layer above the channel region is thereby removed, so that the source electrode 4 and the drain electrode 5 are separated from each other. Further, the ohmic contact layer 3 above the channel region which is now exposed as a result of removing the second metal layer is etched away. The semiconductor layer 2 that serves as the channel region of the TFT 50 is thereby exposed as shown in FIG. 6 and FIGS. 11A to 11C. In this manner, in the first exemplary embodiment, the second metal layer and the ohmic contact layer 3 above the channel region can be removed by using the transparent conductive pattern 6a and the pixel electrode 6 made of the first transparent conductive layer as an etching barrier pattern.

Although etching is performed by using the pixel electrode 6 and the transparent conductive pattern 6a as a mask in the above-described example, etching of the second metal layer and the ohmic contact layer 3 may be performed by utilizing the resist pattern which has been used when patterning the pixel electrode 6 and the transparent conductive pattern 6a as a mask.

Then, the second insulating layer to serve as the interlayer insulating layer 12 is deposited thereon. For example, an inorganic insulating layer such as silicon nitride or silicon oxide is deposited as the interlayer insulating layer 12 all over the substrate 1 by CVD or the like. The pixel electrode 6 and the transparent conductive pattern 6a are thereby covered with the interlayer insulating layer 12. Further, the channel region of the semiconductor layer 2 is covered with the interlayer insulating layer 12. After that, a contact hole is made in the interlayer insulating layer 12 and the gate insulating layer 11 by the fourth photolithography process and the micropatterning process. The contact hole 13 that reaches the common line 43a is thereby made, so that the common line 43a is partly exposed as shown in FIG. 7 and FIGS. 12A to 12C. In the frame area 42, a terminal (not shown) for making a connection with the scanning signal driving circuit 45 or the display signal driving circuit 46 is formed in the same layer as the gate line 43 or the source line 44. Therefore, in the fourth photolithography process and the micropatterning process, a contact hole that reaches the terminal is made in the interlayer insulating layer 12 and the gate insulating layer 11, together with the contact hole 13 that reaches the common line 43a.

After that, on the interlayer insulating layer 12, the second transparent conductive layer such as ITO is deposited all over the substrate 1 by sputtering or the like. Then, the second transparent conductive layer is patterned by the fifth photolithography process and the micropatterning process. The counter electrode 8 having slits is thereby formed opposite to the pixel electrode 6 with the interlayer insulating layer 12 interposed therebetween in such a way that it is connected to the common line 43a through the contact hole 13 as shown in FIG. 8 and FIGS. 13A to 13C. Further, in the frame area 42, a gate terminal pad that is connected to a gate terminal through a contact hole is formed by the second transparent conductive layer, which is the same layer as the counter electrode 8. Likewise, a source terminal pad that is connected to a source terminal through a contact hole is formed by the second transparent conductive layer, which is the same layer as the counter electrode 8.

By the above process, the TFT array substrate according to the first exemplary embodiment is completed. As described above, in the first exemplary embodiment, the TFT array substrate can be formed by five photolithography processes of forming (1) the gate electrode (first metal layer), (2) the source and drain electrodes (the second metal layer), (3) the pixel electrode and the transparent conductive pattern, (4) the contact hole and (5) the counter electrode without using the half-tone mask, which is a general technique of reducing the number of processes. This allows the number of photolithography processes to be equal to the number of photolithography processes which is required to manufacture a TN mode TFT array substrate of a general liquid crystal display device.

Particularly, among the six photolithography processes of forming (1) the counter electrode, (2) the gate electrode (the first metal layer), (3) the semiconductor layer, (4) the source and drain electrodes (the second metal layer), (5) the contact hole and (6) the pixel electrode, which is required to manufacture a TFT array substrate in an FFS mode liquid crystal display device that has been used hitherto, three photolithography processes of forming (3) the semiconductor layer, (4) the source and drain electrodes (the second metal layer) and (6) the pixel electrode can be integrated into two photolithography processes of forming (2) the second metal layer and (3) the pixel electrode and the transparent conductive pattern in the first exemplary embodiment. It is thereby possible to reduce the number of photolithography processes which is required to manufacture a TFT array substrate of an FFS mode liquid crystal display device without using the half-tone mask, thus enabling reduction of manufacturing costs.

On the TFT array substrate that is fabricated in the above-described manner, an alignment layer is formed by the subsequent cell manufacturing process. Further, an alignment layer is formed also on a counter substrate that is fabricated separately. Then, an alignment process is performed on the respective alignment layers so as to make micro scratches in one direction on contact surfaces with liquid crystals. Then, a sealing material is applied onto the peripheral part of the substrate, and TFT array substrate and the counter substrate are attached together with a certain space therebetween in such a way that their alignment layers face each other. After attaching the TFT array substrate and the counter substrate, liquid crystals are injected through a liquid crystal injection port by vacuum injection or the like. The liquid crystal injection port is then sealed. Further, polarizing plates are attached to both sides of a liquid crystal cell that is formed in this manner. Finally, driving circuits are connected, and a backlight unit is mounted. The liquid crystal display device according to the first exemplary embodiment is thereby completed.

Although the structure in which the counter electrodes 8 of the pixels 47 that are adjacent to each other with the gate line 43 interposed therebetween are joined is described in the first exemplary embodiment, the shape of the counter electrode 8 is not limited thereto. The counter electrodes 8 corresponding to the respective pixels 47 are electrically connected to the common lines 43a through the contact hole 13. Therefore, if the same signal is applied to the common lines 43a, the counter electrodes 8 of the pixels 47 that are adjacent to each other with the gate line 43 interposed therebetween may be spaced from each other.

As described above, in the first exemplary embodiment, the second metal layer is patterned in the second photolithography process to thereby form the source and drain electrodes that are connected through the channel region and the source line 44. Then, the ohmic contact layer 3 and the semiconductor layer 2 are etched by using the patterned second metal layer as a mask. After that, the first transparent conductive layer is deposited directly thereon, and the second metal layer and the ohmic contact layer 3 above the channel region are further etched away by using the patterned first transparent conductive layer as a mask in the third photolithography process. This enables reduction of the number of photolithography processes which is required to manufacture the TFT array substrate without using the half-tone mask. It is thereby possible to achieve more stable mass production without complicating process control and also suppress mask costs.

In the TFT array substrate that is fabricated in the above-described manner, the semiconductor layer 2 exists in substantially the whole range (whole area) below the second metal layer that forms the source line 44, the source electrode 4, the drain electrode 5 and so on with the ohmic contact layer 3 interposed therebetween. Further, the first transparent conductive layer that forms the pixel electrode 6, the transparent conductive pattern 6a and so on exists in substantially the whole range (whole area) directly on top of the second metal layer that forms the source line 44, the source electrode 4, the drain electrode 5 and so on. This forms a structure in which the transparent conductive pattern 6a is stacked on the source line 44, thus serving as a redundant line of the source line 44. It is thereby possible to prevent the disruption of the display signal in the event that the source line 44 is broken.

[Second Exemplary Embodiment]

Figure 14:
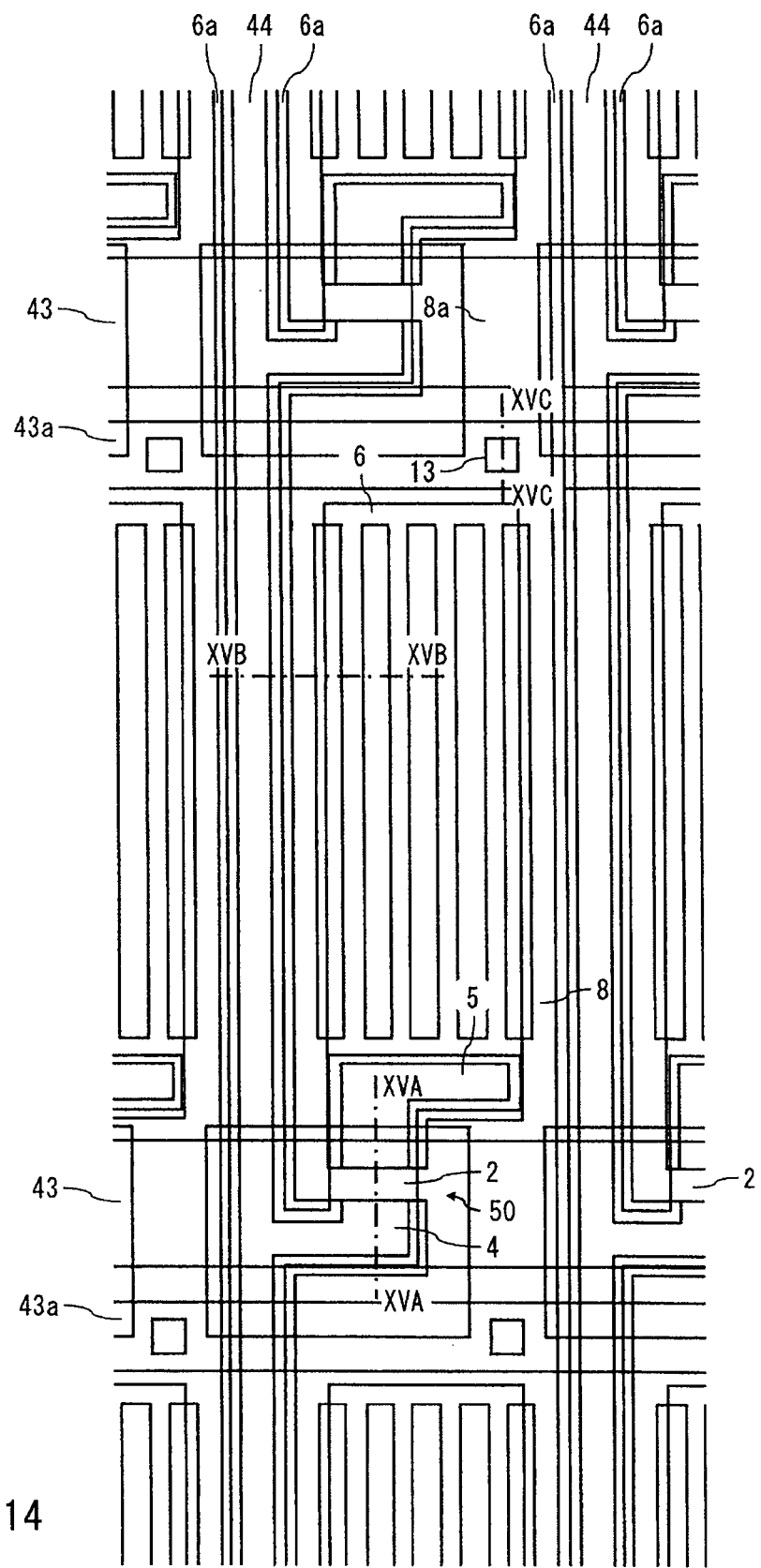
FIG. 14 is a plan view showing a pixel structure of a TFT array substrate according to a second exemplary embodiment.
Figures 15A, 15B, 15C:
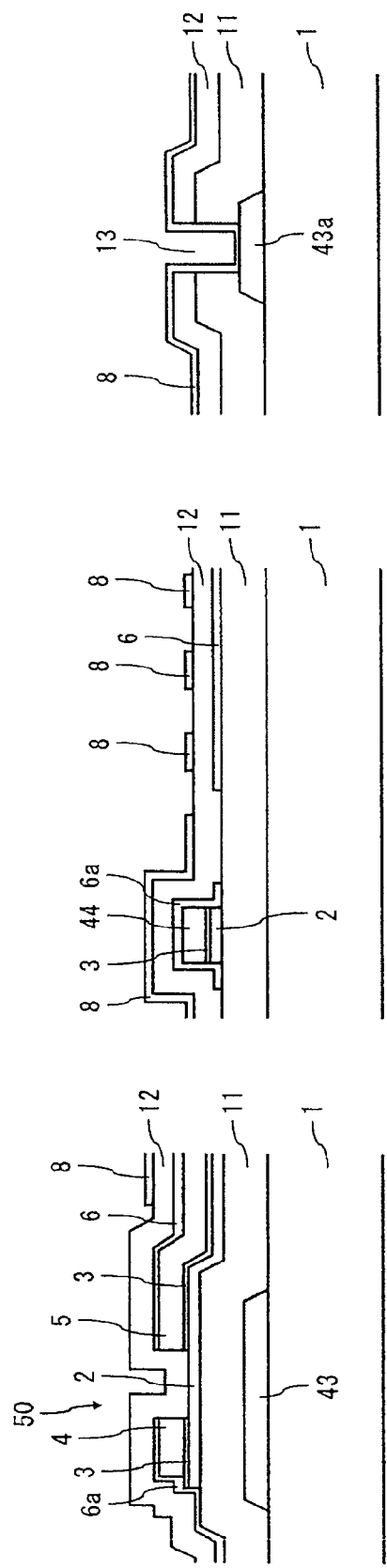
FIG. 15A is a cross-sectional view along line XVA-XVA in FIG. 14.
FIG. 15B is a cross-sectional view along line XVB-XVB in FIG. 14.
FIG. 15C is a cross-sectional view along line XVC-XVC in FIG. 14.

A pixel structure of a liquid crystal display device according to a second exemplary embodiment is described hereinafter with reference to FIG. 14 and FIGS. 15A to 15C. FIG. 14 is a plan view showing the pixel structure of the TFT array substrate according to the second exemplary embodiment. FIGS. 15A to 15C are cross-sectional views showing the pixel structure of the TFT array substrate according to the second exemplary embodiment. FIG. 14 shows one of the pixels 47 of the TFT array substrate. FIG. 15A is a cross-sectional view along line XVA-XVA in FIG. 14, FIG. 15B is a cross-sectional view along line XVB-XVB in FIG. 14, and FIG. 15C is a cross-sectional view along line XVC-XVC in FIG. 14. In the second exemplary embodiment, the shape of the counter electrode 8 is different from that of the first exemplary embodiment. The other structure is the same as that of the first exemplary embodiment and thus not redundantly described below.

In the second exemplary embodiment, the counter electrode 8 is placed to cover the transparent conductive pattern 6a that is located above the source line 44. Specifically, as shown in FIGS. 14 and 15B, the counter electrode 8 that is wider than the source line 44 and the transparent conductive pattern 6a is placed opposite to the source line 44 with the interlayer insulating layer 12 interposed therebetween. The counter electrode 8 covers the most part of the source line 44 of the pixel 47 and the transparent conductive pattern 6a placed thereon. In other words, the most part of the source line 44 and the transparent conductive pattern 6a placed thereon in an area excluding the part intersecting with the gate line 43 overlaps with the counter electrode 8. Thus, the counter electrode 8 is formed to overlap with the source line 44 and the transparent conductive pattern 6a placed thereon in a certain area, and it is connected to the counter electrode 8 of the next pixel 47 that is adjacent with the source line 44 interposed therebetween. The counter electrode 8 in the overlapping area is formed wider than the source line 44 and the transparent conductive pattern 6a placed thereon.

Note that, in the second exemplary embodiment, as in the first exemplary embodiment, the semiconductor layer 2 exists in substantially the whole range (whole area) below the second metal layer that forms the source line 44, the source electrode 4, the drain electrode 5 and so on with the ohmic contact layer 3 interposed therebetween as shown in FIG. 14 and FIGS. 15A to 15C. Further, the first transparent conductive layer that forms the pixel electrode 6, the transparent conductive pattern 6a and so on exists in substantially the whole range (whole area) directly on top of the second metal layer that forms the source line 44, the source electrode 4, the drain electrode 5 and so on.

In the TFT array substrate having such a structure, the counter electrode 8 having a different shape from that of the first exemplary embodiment can be formed in the fifth photolithography process and the micropatterning process. The other manufacturing process is the same as that of the first exemplary embodiment and thus not redundantly described.

As described above, in the second exemplary embodiment, the counter electrode 8 is formed to cover the most part of the stacked layer of the source line 44 and the transparent conductive pattern 6a placed thereon in an area excluding the part intersecting with the gate line 43. A leakage electric field that is generated from the source line 44 and the transparent conductive pattern 6a placed on the source line 44 can be thereby effectively blocked by the counter electrode 8. It is thereby possible to reduce crosstalk that is caused by the leakage electric field from the source line 44 and the transparent conductive pattern 6a placed thereon. Further, the same advantage as the first exemplary embodiment can be obtained.

[Third Exemplary Embodiment]

Figure 16:
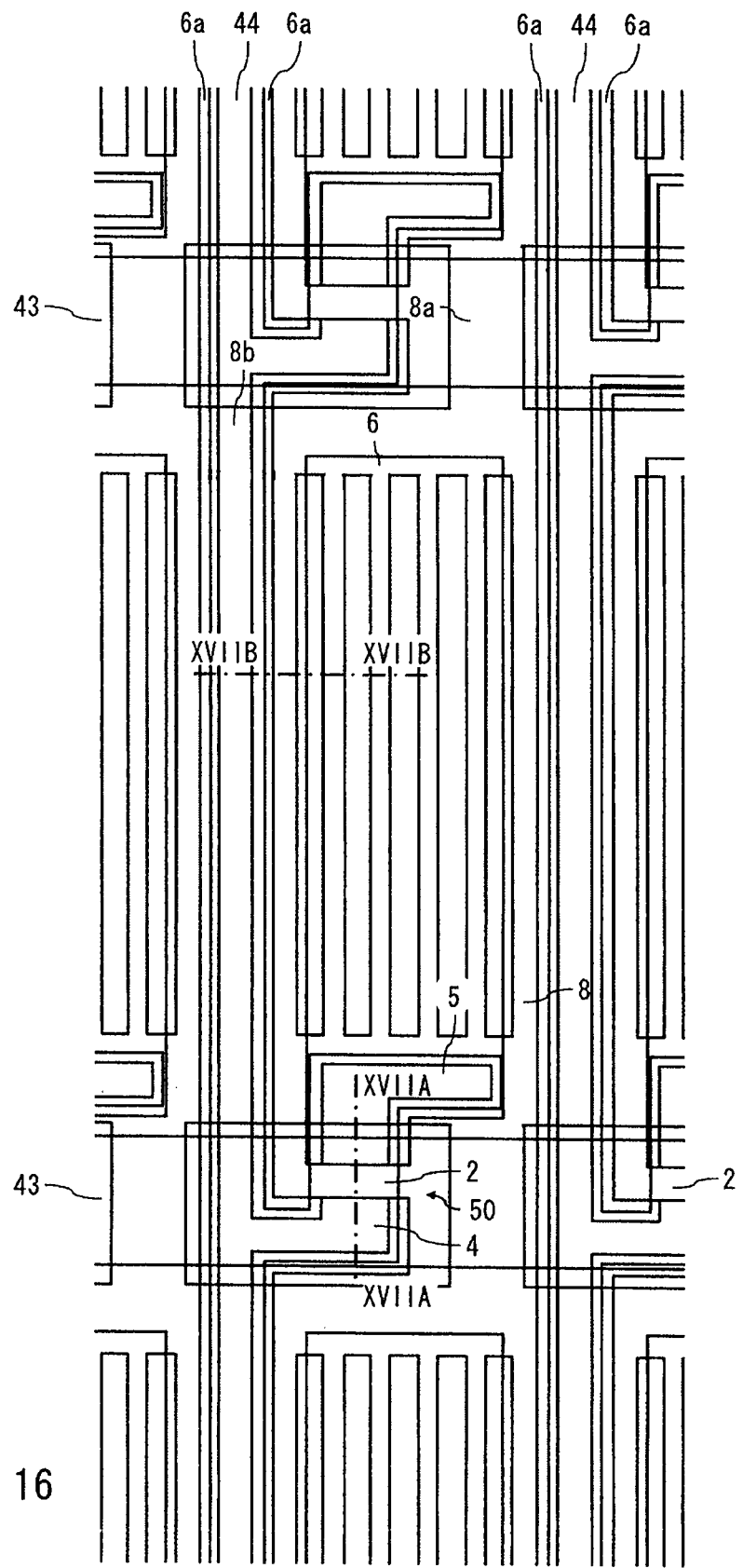
FIG. 16 is a plan view showing a pixel structure of a TFT array substrate according to a third exemplary embodiment.
Figures 17A, 17B:
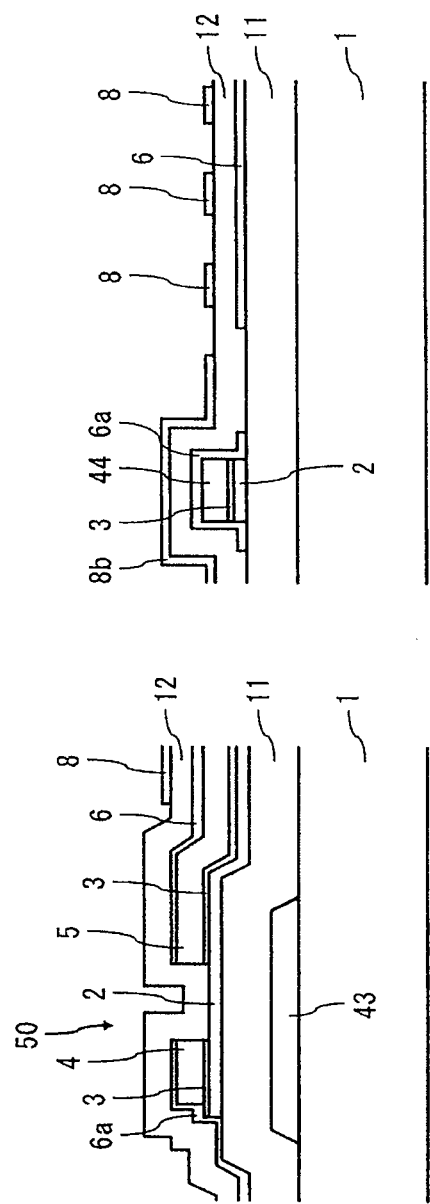
FIG. 17A is a cross-sectional view along line XVIIA-XVIIA in FIG. 16.
FIG. 17B is a cross-sectional view along line XVIIB-XVIIB in FIG. 16.

A pixel structure of a liquid crystal display device according to a third exemplary embodiment is described hereinafter with reference to FIG. 16 and FIGS. 17A and 17B. FIG. 16 is a plan view showing the pixel structure of the TFT array substrate according to the third exemplary embodiment. FIGS. 17A and 17B are cross-sectional views showing the pixel structure of the TFT array substrate according to the third exemplary embodiment. FIG. 16 shows one of the pixels 47 of the TFT array substrate. FIG. 17A is a cross-sectional view along line XVIIA-XVIIA in FIG. 16, and FIG. 17B is a cross-sectional view along line XVIIB-XVIIB in FIG. 16.

In the first exemplary embodiment, a signal is supplied to the counter electrode 8 of each pixel 47 from the common line 43a that is electrically connected to the counter electrode 8 through the contact hole 13 of each pixel 47. On the other hand, in the third exemplary embodiment, a signal is supplied to the counter electrode 8 from the peripheral part of the display area 41 through the counter electrode 8 that is joined together among all adjacent pixels 47.

Specifically, as shown in FIG. 16, the respective counter electrodes 8 of the pixels 47 that are adjacent with the gate line 43 interposed therebetween are joined by the joint portion 8a. The joint portion 8a is placed to come over the gate line 43 and thereby joins the counter electrodes 8 of the pixels 47 that are adjacent to each other with the gate line 43 interposed therebetween. In this example, the joint portion 8a of the counter electrode 8 is placed to step over the gate line 43 in an area not overlapping with the source line 44 or the TFT 50.

Further, the counter electrodes 8 of the pixels 47 that are adjacent to each other with the source line 44 interposed therebetween are joined by a joint portion 8b. The joint portion 8b is placed to come over the source line 44 and thereby joins the counter electrodes 8 of the pixels 47 that are adjacent to each other with the source line 44 interposed therebetween. In this example, the joint portion 8b of the counter electrode 8 is placed to step over the most part of the stacked layer of the source line 44 and the transparent conductive pattern 6a placed thereon in an area excluding the part intersecting with the gate line 43.

As described above, the counter electrode 8 is joined two-dimensionally and electrically connected to the counter electrodes 8 of all the adjacent pixels 47. Thus, the counter electrodes 8 of all the pixels 47 in the display area 41 are electrically connected. Therefore, it is possible to reduce the resistance of the counter electrode 8 despite that it is formed by a transparent conductive layer with relatively high resistance. Therefore, in the third exemplary embodiment, there is no need to form the non-transmitting common line 43a with relatively low resistance which is placed in order to supply a signal to the counter electrode 8 of each pixel 47. Further, there is no need to form the contact hole 13 for making a connection with the common line 43a.

Note that, in the third exemplary embodiment, as in the first exemplary embodiment, the semiconductor layer 2 exists in substantially the whole range (whole area) below the second metal layer that forms the source line 44, the source electrode 4, the drain electrode 5 and so on with the ohmic contact layer 3 interposed therebetween as shown in FIG. 16 and FIGS. 17A to 17C. Further, the first transparent conductive layer that forms the pixel electrode 6, the transparent conductive pattern 6a and so on exists in substantially the whole range (whole area) directly on top of the second metal layer that forms the source line 44, the source electrode 4, the drain electrode 5 and so on.

In the TFT array substrate having such a structure, it is not necessary to form the common line 43a in the first photolithography process and the micropatterning process. Further, it is not necessary to make the contact hole 13 of each pixel 47 in the fourth photolithography process and the micropatterning process. However, it is necessary to make a contact hole in the peripheral part of the display area 41 so as to supply a signal to the counter electrode 8. Then, the counter electrode 8 having a different shape from that of the first exemplary embodiment is formed in the fifth photolithography process and the micropatterning process. The other manufacturing process is the same as that of the first exemplary embodiment and thus not redundantly described.

As described above, in the third exemplary embodiment, the counter electrodes 8 are joined among the adjacent pixels. Thus, the counter electrode 8 is joined with the counter electrodes 8 of the pixels that are adjacent with the source line 44 and the gate line 43 interposed therebetween. The counter electrodes 8 of all the pixels 47 in the display area 41 are thereby integrally formed and electrically connected. It is thereby possible to reduce the resistance of the counter electrodes 8 and eliminate the need to form the non-transmitting common line 43*a*, thereby improving the aperture ratio. Further, the same advantage as the first exemplary embodiment can be obtained.

[Fourth Exemplary Embodiment]

Figure 18A:
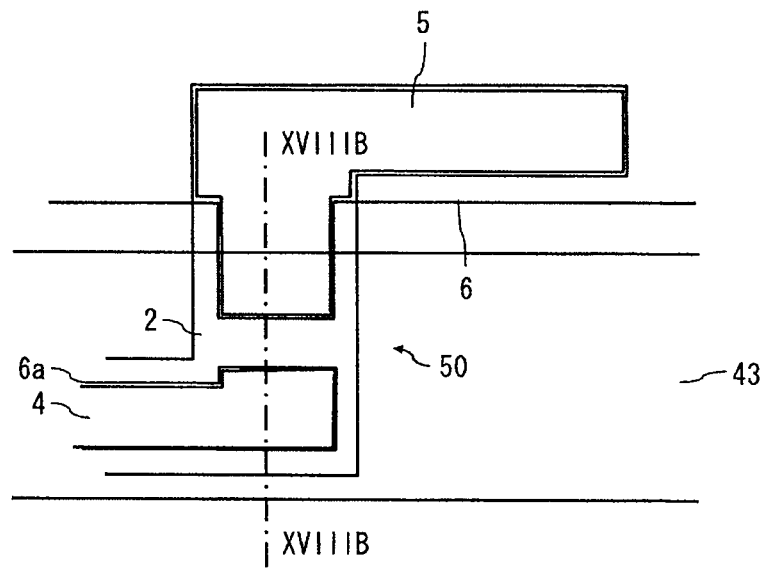
FIG. 18A is a plan view showing a structure of a TFT part of a TFT array substrate according to a fourth exemplary embodiment.
Figure 18B:
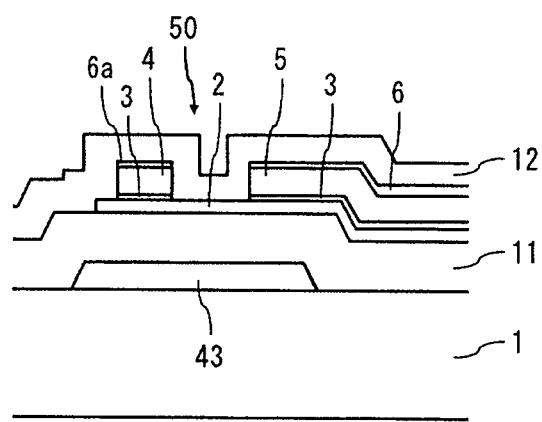
FIG. 18B is a cross-sectional view along line XVIIIB-XVIIIB in FIG. 18A.

A liquid crystal display device according to a fourth exemplary embodiment is described hereinafter with reference to FIGS. 18A and 18B. FIGS. 18A and 18B are views showing a structure of a TFT part of a TFT array substrate according to the fourth exemplary embodiment. FIG. 18A is a plan view showing a structure of the TFT part of the TFT array substrate according to the fourth exemplary embodiment, and FIG. 18B is a cross-sectional view along line XVIIIB-XVIIIB in FIG. 18A. FIGS. 18A and 18B show one TFT 50 provided in each pixel 47 of the TFT array substrate. In the fourth exemplary embodiment, the TFT 50 having a different structure from that of the first to third exemplary embodiments is placed in the TFT array substrate. The other structure is the same as that of the first to third exemplary embodiments and thus not redundantly described.

In the fourth exemplary embodiment, the pixel electrode 6 and the transparent conductive pattern 6*a* are placed on the inside of the pattern end of the semiconductor layer 2 above the gate line 43 as shown in FIGS. 18A and 18B. Specifically, in the first to third exemplary embodiments, the pixel electrode 6 and the transparent conductive pattern 6*a* are placed to cover the pattern ends of the source electrode 4 and the drain electrode 5 other than the ends on the channel region side and come into contact with the end of the semiconductor layer 2 that exists therebelow with the ohmic contact layer 3 interposed therebetween. On the other hand, in the fourth exemplary embodiment, the pixel electrode 6 and the transparent conductive pattern 6*a* do not cover the pattern ends of the source electrode 4 and the drain electrode 5 other than the ends on the channel region side as well as the pattern ends on the channel region side.

Further, the pattern end of the pixel electrode 6 is located in substantially the same position as the pattern end of the drain electrode 5 in an area opposite to the gate electrode. Likewise, in the area opposite to the gate electrode, the pattern end of the transparent conductive pattern 6*a* is located in substantially the same position as the pattern end of the source electrode 4. In this manner, the pixel electrode 6 and the transparent conductive pattern 6*a* that are made of the first transparent conductive layer are not in contact with the end of the semiconductor layer 2 above the gate electrode in the TFT 50 according to the fourth exemplary embodiment.

It is likely that conductive residue exists at the pattern end of the semiconductor layer 2, and if the pixel electrode 6 or the transparent conductive pattern 6*a* comes into contact with the pattern end of the semiconductor layer 2 above the gate electrode, there is a possibility that off-current of the TFT 50 increases. On the other hand, because the pixel electrode 6 and the transparent conductive pattern 6*a* are not in contact with the end of the semiconductor layer 2 above the gate electrode in the fourth exemplary embodiment, it is possible to suppress an increase in off-current of the TFT 50.

Figure 19A:
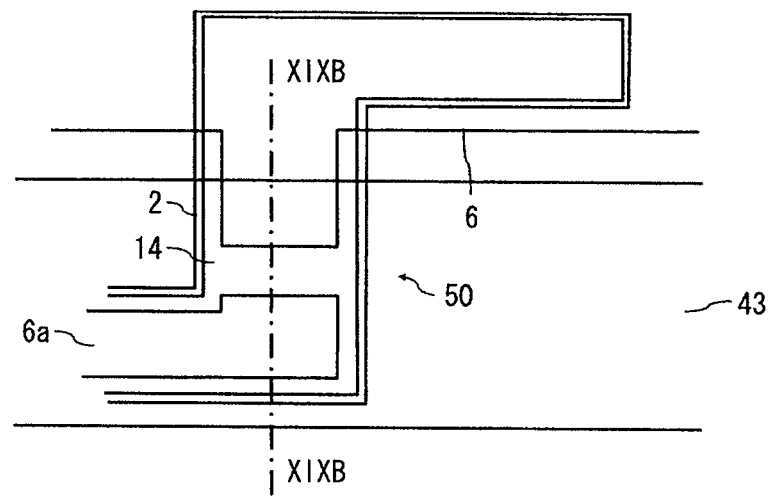
FIG. 19A is a plan view showing one manufacturing step of the TFT array substrate according to the fourth exemplary embodiment.
Figure 19B:
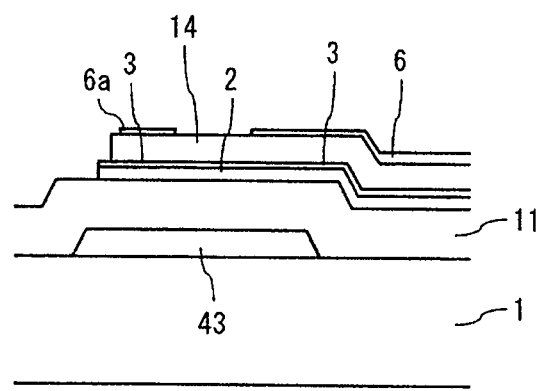
FIG. 19B is a cross-sectional view along line XIXB-XIXB in FIG. 19A.

A method of manufacturing the liquid crystal display device according to the fourth exemplary embodiment is described hereinafter with reference to FIGS. 19A and 19B. FIGS. 19A and 19B are views showing one manufacturing step of the TFT array substrate according to the fourth exemplary embodiment. FIG. 19A is a plan view showing the TFT part after forming the pixel electrode and the transparent conductive pattern, and FIG. 19B is a cross-sectional view along line XIXB-XIXB in FIG. 19A. In the fourth exemplary embodiment, the process of forming the pixel electrode 6 and the transparent conductive pattern 6*a* is different from the first to third exemplary embodiments. The other manufacturing process is the same as that of the first to third exemplary embodiments and not redundantly described. Specifically, the first transparent conductive layer that is deposited all over the substrate 1 is patterned in such a way that the end of a second metal layer pattern 14 above the gate electrode is exposed as shown in FIGS. 19A and 19B, thereby forming the pixel electrode 6 and the transparent conductive pattern 6*a*. Then, by using the pixel electrode 6 and the transparent conductive pattern 6*a* in which the end of the second metal layer pattern 14 above the gate electrode is exposed in this manner, the exposed part of the second metal layer and the ohmic contact layer 3 are etched.

As described above, in the fourth exemplary embodiment, the pixel electrode 6 and the transparent conductive pattern 6*a* are placed on the inside of the pattern of the semiconductor layer 2 when viewed from above in the position opposite to the gate electrode. The pixel electrode 6 and the transparent conductive pattern 6*a* are thereby not in contact with the end of the semiconductor layer 2 above the gate electrode. It is thereby possible to suppress an increase in off-current of the TFT 50. Further, the same advantage as the first to third exemplary embodiments can be obtained.

It should be noted that, although the case where the slits of the counter electrode 8 are in parallel with the source lines 44 is described by way of illustration in the first to third exemplary embodiments, the present invention is not limited thereto. The direction of the slits of the counter electrode 8 is not limited to the direction in parallel with the source lines 44, and it may be an arbitrary direction or a combination of arbitrary different directions. Further, the shape of the counter electrode 8 is not limited to a shape with slits, and it may be a comb-shape, for example, as long as a fringe electric field can be generated between the counter electrode 8 and the pixel electrode 6.

Further, the TFT 50 in the pixel structure according to the first to third exemplary embodiments can be replaced with the TFT 50 having the structure described in the fourth exemplary embodiment. Furthermore, the present invention is not limited to the TFT array substrate that includes the TFT 50 having the structure described in the first to fourth exemplary embodiments, and it may be applied to the TFT array substrate that includes the TFT 50 having another structure in which the pixel electrode 6 is directly placed on the drain electrode 5.

The explanation provided above merely illustrates exemplary embodiments of the present invention, and the present invention is not limited to the first to fourth exemplary embodiments. A person skilled in the art will be able to easily change, add, or modify various elements of the first to fourth exemplary embodiments, without departing from the scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin-film transistor array substrate including a thin-film transistor, comprising:
a gate line that is formed over a substrate and connected to a gate electrode of the thin-film transistor;
a gate insulating layer that covers the gate electrode and the gate line;
a source line that is formed above the gate insulating layer and connected to a source electrode of the thin-film transistor;
a semiconductor layer that is formed on the gate insulating layer and placed in a substantially whole area below a drain electrode of the thin-film transistor, in a substantially whole area below the source electrode, in a substantially whole area below the source line and in a position opposite to the gate electrode;
a pixel electrode that is formed directly on the drain electrode and electrically connected to the drain electrode;
a transparent conductive pattern that is formed directly on the source electrode and the source line in the same layer as the pixel electrode;
an interlayer insulating layer that covers the pixel electrode and the transparent conductive pattern; and
a counter electrode that is formed on the interlayer insulating layer and generates a fringe electric field with the pixel electrode, wherein the pixel electrode and the transparent conductive pattern are placed on an inside of a pattern of the semiconductor layer when viewed from above in a position opposite to the gate electrode.

2. The thin-film transistor array substrate according to claim 1, wherein the counter electrode is formed to overlap with the source line and the transparent conductive pattern on the source line in a certain area and connected to a counter electrode in a pixel adjacent with the source line interposed therebetween.

3. The thin-film transistor array substrate according to claim 2, wherein the counter electrode in the area overlapping with the source line and the transparent conductive pattern on the source line is wider than the source line and the transparent conductive pattern on the source line.

4. The thin-film transistor array substrate according to claim 2, wherein the counter electrode is formed in an area which does not overlap with an intersection between the gate line and the source line and does not overlap with the thin-film transistor.

5. The thin-film transistor array substrate according to claim 1, wherein the counter electrode is connected to a counter electrode in a pixel adjacent with the gate line interposed therebetween.

6. The thin-film transistor array substrate according to claim 1, further comprising:
an ohmic contact layer that is formed between the source electrode and the semiconductor layer, between the drain electrode and the semiconductor layer and between the source line and the semiconductor layer, wherein the semiconductor layer is electrically connected to the source electrode and the drain electrode through the ohmic contact layer.

7. A liquid crystal display device comprising the thin-film transistor array substrate according to claim 1.

8. A thin-film transistor array substrate including a thin-film transistor, comprising:
a gate line that is formed over a substrate and connected to a gate electrode of the thin-film transistor;
a gate insulating layer that covers the gate electrode and the gate line;
a source line that is formed above the gate insulating layer and connected to a source electrode of the thin-film transistor;
a semiconductor layer that is formed on the gate insulating layer and placed in a substantially whole area below a drain electrode of the thin-film transistor, in a substantially whole area below the source electrode, in a substantially whole area below the source line and in a position opposite to the gate electrode;
a pixel electrode that is formed directly on the drain electrode and electrically connected to the drain electrode;
a transparent conductive pattern that is formed directly on the source electrode and the source line in the same layer as the pixel electrode;
an interlayer insulating layer that covers the pixel electrode and the transparent conductive pattern;
a counter electrode that is formed on the interlayer insulating layer and generates a fringe electric field with the pixel electrode; and
a common line that is formed in the same layer as the gate line, wherein the counter electrode is electrically connected to the common line through a contact hole penetrating the gate insulating layer and the interlayer insulating layer.

9. A method of manufacturing a thin-film transistor array substrate including a thin-film transistor, comprising steps of:
forming a gate electrode of the thin-film transistor and a gate line connected to the gate electrode over a substrate;
forming a gate insulating layer that covers the gate electrode and the gate line;
depositing a semiconductor layer, an ohmic contact layer and a metal layer in this sequence on the gate insulating layer;
patterning the metal layer and forming a source electrode and a drain electrode of the thin-film transistor being joined above a part of the semiconductor layer to serve as a channel region of the thin-film transistor and a source line connected to the source electrode;
etching the semiconductor layer and the ohmic contact layer by using the patterned metal layer as a mask;
forming a pixel electrode directly on the drain electrode and a transparent conductive pattern directly on the source electrode and the source line by depositing a transparent conductive layer directly on the metal layer and patterning the transparent conductive layer;
etching the metal layer and the ohmic contact layer by using the pixel electrode and the transparent conductive pattern as a mask so as to expose the part of the semiconductor layer to serve as the channel region of the thin-film transistor;
forming an interlayer insulating layer that covers the pixel electrode and the transparent conductive pattern; and
forming a counter electrode that generates a fringe electric field with the pixel electrode on the interlayer insulating layer, wherein
in the step of forming the pixel electrode and the transparent conductive pattern, the pixel electrode and the transparent conductive pattern are formed so as to be placed on an inside of a pattern of the semiconductor layer when viewed from above in a position opposite to the gate electrode.

10. The method of manufacturing according to claim 9, wherein in the step of forming the counter electrode, the counter electrode is formed to overlap with the source line and the transparent conductive pattern on the source line in a certain area and to be connected to a counter electrode in a pixel adjacent with the source line interposed therebetween.

11. The method of manufacturing according to claim 10, wherein the counter electrode in the area overlapping with the source line and the transparent conductive pattern on the source line is wider than the source line and the transparent conductive pattern on the source line.

12. The method of manufacturing according to claim 10, wherein the counter electrode is formed in an area which does not overlap with an intersection between the gate line and the source line and does not overlap with the thin-film transistor.

13. The method of manufacturing according to claim 9, wherein in the step of forming the counter electrode, the counter electrode is formed to be connected to a counter electrode in a pixel adjacent with the gate line interposed therebetween.

14. A method of manufacturing a thin-film transistor array substrate including a thin-film transistor, comprising steps of:

forming a gate electrode of the thin-film transistor and a gate line connected to the gate electrode over a substrate;

forming a gate insulating layer that covers the gate electrode and the gate line;

depositing a semiconductor layer, an ohmic contact layer and a metal layer in this sequence on the gate insulating layer;

patterning the metal layer and forming a source electrode and a drain electrode of the thin-film transistor being joined above a part of the semiconductor layer to serve as a channel region of the thin-film transistor and a source line connected to the source electrode;

etching the semiconductor layer and the ohmic contact layer by using the patterned metal layer as a mask;

forming a pixel electrode directly on the drain electrode and a transparent conductive pattern directly on the source electrode and the source line by depositing a transparent conductive layer directly on the metal layer and patterning the transparent conductive layer;

etching the metal layer and the ohmic contact layer by using the pixel electrode and the transparent conductive pattern as a mask so as to expose the part of the semiconductor layer to serve as the channel region of the thin-film transistor;

forming an interlayer insulating layer that covers the pixel electrode and the transparent conductive pattern; and forming a counter electrode that generates a fringe electric field with the pixel electrode on the interlayer insulating layer, wherein in the step of forming the gate electrode and the gate line, a common line is further formed between adjacent gate lines, and in the step of forming the counter electrode, the counter electrode is formed so as to be electrically connected to the common line through a contact hole penetrating the gate insulating layer and the interlayer insulating layer.

* * * * *